US008500466B2

(12) United States Patent
Zhang et al.

(10) Patent No.: US 8,500,466 B2
(45) Date of Patent: Aug. 6, 2013

(54) ELECTRONIC APPARATUS WITH PLUG

(75) Inventors: Bin Zhang, Shenzhen (CN); Yanzhu Huang, Shenzhen (CN); Guangsheng Liu, Shenzhen (CN); Jie Li, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 0 days.

(21) Appl. No.: 13/469,810

(22) Filed: May 11, 2012

(65) Prior Publication Data

US 2012/0225569 A1 Sep. 6, 2012

Related U.S. Application Data

(63) Continuation of application No. PCT/CN2010/078613, filed on Nov. 10, 2010.

(30) Foreign Application Priority Data

Nov. 11, 2009 (CN) ........................ 2009 2 0179928 U

(51) Int. Cl.
*H01R 13/44* (2006.01)

(52) U.S. Cl.
USPC .......................................................... 439/131

(58) Field of Classification Search
USPC .......................................................... 439/131
See application file for complete search history.

(56) References Cited

U.S. PATENT DOCUMENTS

| | | | |
|---|---|---|---|
| 6,456,500 B1 * | 9/2002 | Chen .............................. 361/752 |
| 6,792,487 B2 * | 9/2004 | Kao ................................. 710/74 |
| 7,303,411 B1 * | 12/2007 | Morganstern et al. ........ 439/131 |
| 7,307,849 B2 * | 12/2007 | Ho et al. ........................ 361/737 |
| 7,361,032 B2 * | 4/2008 | Loftus ............................ 439/131 |
| 7,422,454 B1 * | 9/2008 | Tang et al. .................... 439/131 |
| 7,524,198 B2 * | 4/2009 | Nguyen et al. ................ 439/131 |
| 7,535,719 B2 * | 5/2009 | Hiew et al. .................... 361/737 |
| 7,558,069 B2 * | 7/2009 | Chung ........................... 361/737 |
| 7,558,070 B2 * | 7/2009 | Kang ............................. 361/752 |

(Continued)

FOREIGN PATENT DOCUMENTS

| | | |
|---|---|---|
| CN | 2800528 Y | 7/2006 |
| CN | 201576814 U | 9/2010 |

OTHER PUBLICATIONS

International Search Report and Written Opinion of the International Searching Authority issued in corresponding PCT Patent Application No. PCT/CN2010/078613, mailed Feb. 17, 2011.

*Primary Examiner* — Ross Gushi

(74) *Attorney, Agent, or Firm* — Brinks Hofer Gilson & Lione

(57) ABSTRACT

An electronic apparatus with a plug is provided, which relates to the field of electronic technologies, and solves a technical problem of the plug is easily damaged when the plug in a state of extending out of a port is impacted by a force in a direction in which the plug retracts into the port. The electronic apparatus with a plug includes a housing opened with a port, a plug passing through the port, and a circuit board located inside the housing and electrically connected to the plug, where a locking mechanism is disposed between the plug and the housing, the locking mechanism is configured to lock the plug when the plug is in a state of extending out of the port, and the locking mechanism automatically becomes ineffective when the plug is impacted by the force in the direction in which the plug retracts into the port.

18 Claims, 5 Drawing Sheets

U.S. PATENT DOCUMENTS

| | | | | |
|---|---|---|---|---|
| 7,581,967 | B2 * | 9/2009 | Collantes et al. | 439/131 |
| 7,628,622 | B2 * | 12/2009 | Yu et al. | 439/131 |
| 7,674,120 | B2 * | 3/2010 | Morganstern et al. | 439/131 |
| 7,740,492 | B2 * | 6/2010 | Dei Rossi et al. | 439/131 |
| 7,740,493 | B2 * | 6/2010 | Ni et al. | 439/131 |
| 7,811,101 | B2 * | 10/2010 | Tang et al. | 439/131 |
| 7,841,873 | B2 * | 11/2010 | Zhu et al. | 439/131 |
| 7,850,468 | B2 * | 12/2010 | Ni et al. | 439/131 |
| 7,869,219 | B2 * | 1/2011 | Ma et al. | 361/737 |
| 8,043,101 | B2 * | 10/2011 | Zhang et al. | 439/133 |
| 8,116,083 | B2 * | 2/2012 | Ni et al. | 361/737 |
| 8,184,441 | B2 * | 5/2012 | Meng et al. | 361/730 |
| 8,192,211 | B1 * | 6/2012 | Huang | 439/131 |
| 8,345,417 | B2 * | 1/2013 | Lo | 361/679.31 |
| 8,353,709 | B2 * | 1/2013 | Tang et al. | 439/131 |
| 8,382,495 | B1 * | 2/2013 | Ma | 439/131 |
| 8,388,361 | B2 * | 3/2013 | Wavra et al. | 439/131 |
| 2008/0160802 | A1 * | 7/2008 | Ni et al. | 439/131 |
| 2008/0160803 | A1 * | 7/2008 | Morganstern et al. | 439/131 |
| 2008/0233776 | A1 * | 9/2008 | Tang et al. | 439/131 |
| 2008/0305662 | A1 * | 12/2008 | Regen et al. | 439/131 |
| 2009/0004897 | A1 * | 1/2009 | Tang et al. | 439/131 |
| 2009/0124104 | A1 * | 5/2009 | Zhu et al. | 439/131 |
| 2009/0177835 | A1 | 7/2009 | Ma et al. | |
| 2009/0275224 | A1 * | 11/2009 | Ni et al. | 439/131 |
| 2010/0009560 | A1 * | 1/2010 | Youn | 439/131 |
| 2010/0039225 | A1 * | 2/2010 | Yu et al. | 340/5.83 |
| 2010/0124831 | A1 * | 5/2010 | Chou et al. | 439/131 |
| 2010/0248510 | A1 * | 9/2010 | Zhang et al. | 439/131 |
| 2010/0281209 | A1 * | 11/2010 | Ni et al. | 711/103 |
| 2010/0311257 | A1 * | 12/2010 | Meng et al. | 439/131 |
| 2010/0321878 | A1 * | 12/2010 | Huang | 361/679.31 |
| 2011/0059636 | A1 * | 3/2011 | Ni et al. | 439/131 |
| 2011/0130017 | A1 * | 6/2011 | Chou et al. | 439/131 |
| 2011/0269335 | A1 * | 11/2011 | Zhang et al. | 439/502 |
| 2012/0015534 | A1 * | 1/2012 | Wavra et al. | 439/131 |
| 2012/0225569 | A1 * | 9/2012 | Zhang et al. | 439/55 |
| 2013/0052845 | A1 * | 2/2013 | Ma | 439/131 |
| 2013/0109206 | A1 * | 5/2013 | Yamaguchi et al. | 439/131 |
| 2013/0113663 | A1 * | 5/2013 | Zhang et al. | 343/702 |

* cited by examiner

ELECTRONIC APPARATUS WITH PLUG

CROSS-REFERENCE TO RELATED APPLICATIONS

This application is a continuation of International Application No. PCT/CN2010/078613, filed on Nov. 10, 2010, which claims priority to Chinese Patent Application No. 200920179928.5, filed on Nov. 11, 2009, both of which are hereby incorporated by reference in their entireties.

FIELD OF THE INVENTION

The present invention relates to the field of electronic technologies, and in particular, to an electronic apparatus with a plug.

BACKGROUND OF THE INVENTION

With the ongoing development of electronic technologies, various electronic apparatuses with a plug such as a Universal Serial Bus (USB) flash drive already become one of indispensable electronic apparatuses in the daily life and office work of people.

As shown in FIG. 1, an existing electronic apparatus with a plug includes a housing 2 opened with a port 1, a plug 3 passing through the port 1, and a circuit board 4 located inside the housing 2 and electrically connected to the plug 3, where the circuit board 4 is fixedly connected to the plug 3, a locking structure 5 is disposed between the circuit board 4 and the housing 2, and the locking structure 5 is configured to lock the plug 3 when the plug 3 is in a state of extending out of the port 1. The locking structure 5 includes a stop slot 15 disposed on an inner wall of the housing 2, a support 16 fixedly connected to the circuit board 4, and a button 8 having an end extending out of the housing 2. The housing 2 is opened with a sliding slot in parallel with the direction in which the plug 3 retracts into or extends out of the port 1. The end of the button 8 which is extending out of the housing 2 may slide inside the sliding slot, and a side of the button 8 located inside the housing 2 is fixedly disposed with a stop portion 80 having a shape matching with the stop slot 15. The end of the button 8 which is far away from the stop portion 80 is inserted inside the support 16, and a spring 17 is fixedly disposed between the end and the support 16. An elastic force direction of the spring 17 extends in a direction towards the sliding slot.

When the electronic apparatus with a plug needs to be used, the button 8 is pushed in a direction towards the port 1, so that the button 8 drives the circuit board 4 and the plug 3 to slide along the sliding slot in a direction towards the port 1 through the support 16. When the plug 3 is in a state of extending out of the port 1, under the effect of the spring 17, the stop portion 80 on the button 8 is just sprung into the stop slot 15, and at this time, the button 8, the circuit board 4, and the plug 3 are all locked by a fitting structure formed of the stop portion 80 and the stop slot 15. After using the electronic apparatus with a plug is finished, the button 8 may be pushed to compress the spring 17 and press the stop portion 80 of the button 8 out of the stop slot 15, and at the same time, the button 8 is pushed in a direction away from the port 1, so that the plug 3 is pushed back to enable the plug 3 to be in a state of retracting into the port 1.

The prior art has the following disadvantages. When the plug 3 shown in FIG. 1 is in a state of extending out of the port 1, the locking structure 5 locks the plug 3 to make the position thereof fixed so that the plug 3 is unable to move. When the apparatus that the plug 3 is in the state of extending out of the port 1 is dropped on the floor by accident and the plug 3 is impacted, or the apparatus that is already plugged into the slot is impacted by accident, the plug 3 is impacted by a force in the direction in which the plug 3 retracts into the port 1. The impact force is usually greater than the push force applied on the plug 3 by people when the plug 3 is being plugged into the slot, the impact force is abrupt, and the force points are usually centralized, so the plug 3 is easily damaged.

SUMMARY OF THE INVENTION

Embodiments of the present invention provide an electronic apparatus with a plug, which solves the technical problem that a plug of an existing electronic apparatus with a plug is easily damaged when the plug in a state of extending out of a port is impacted by a force in a direction in which the plug retracts into the port.

In order to achieve the objects, the embodiment of the present invention adopts the following technical solutions.

An electronic apparatus with a plug includes a housing opened with a port, a plug passing through the port, and a circuit board located inside the housing and electrically connected to the plug, where a locking mechanism is disposed between the plug and the housing, the locking mechanism is configured to lock the plug when the plug in a state of extending out of the port, and the locking mechanism automatically becomes ineffective when the plug is impacted by a force in a direction in which the plug retracts into the port.

Compared with the prior art, the technical solutions provided in the present invention have the following advantages.

As in the embodiment of the present invention, the locking mechanism automatically becomes ineffective when the plug is impacted by a force in a direction in which the plug retracts into the port, when the apparatus that the plug is in the state of extending out of the port is dropped on the floor by accident and the plug is impacted, or the apparatus that is already plugged into the slot is impacted by accident, the locking mechanism automatically becomes ineffective. After the locking mechanism automatically becomes ineffective, the plug may slide in the direction in which the plug retracts into the port, and under the effect of the impact force, the plug slides back into the housing in the direction in which the plug retracts into the port. The larger the impact force is, the larger the distance that the plug is retracted in the direction in which the plug retracts into the port, so that a buffering effect is achieved for the impact force, thereby preventing the impact force from damaging the plug, which solves the technical problem that a plug of an existing electronic apparatus with a plug is easily damaged when the plug in a state of extending out of a port is impacted by a force in a direction in which the plug retracts into the port.

BRIEF DESCRIPTION OF THE DRAWINGS

To illustrate the technical solutions according to the embodiments of the present invention more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

The technical solution of the present invention will be clearly and completely described in the following with reference to the accompanying drawings. It is obvious that the embodiments to be described are only a part rather than all of the embodiments of the present invention. All other embodiments obtained by persons skilled in the art based on the embodiments of the present invention without creative efforts shall fall within the protection scope of the present invention.

An embodiment of the present invention provides an electronic apparatus with a plug having a simple structure and high reliability, where a plug in a state of extending out of a port is not easily damaged by impact.

Figure 2:
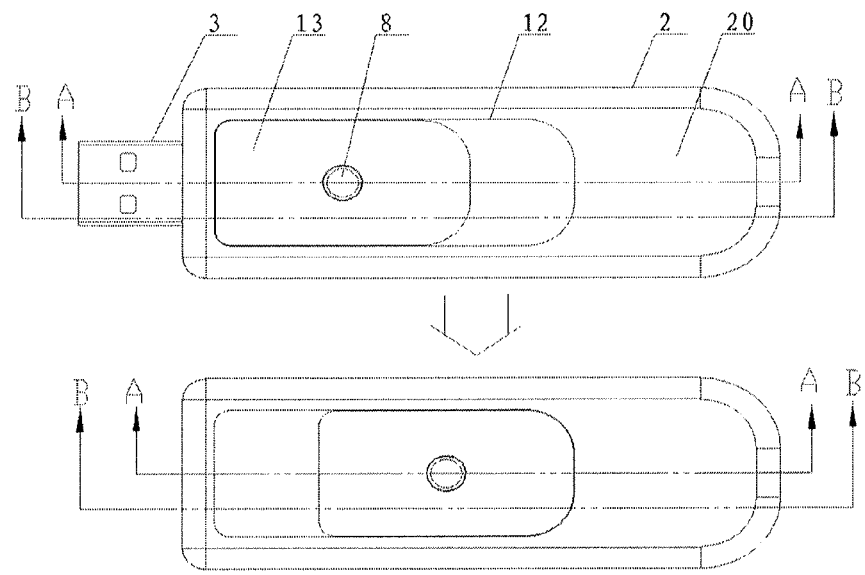
FIG. 2 is a schematic plan view of a process that a plug in an electronic apparatus with a plug switches from a state of extending out of a port into a state of retracting into the port according to an embodiment of the present invention.
Figure 3:
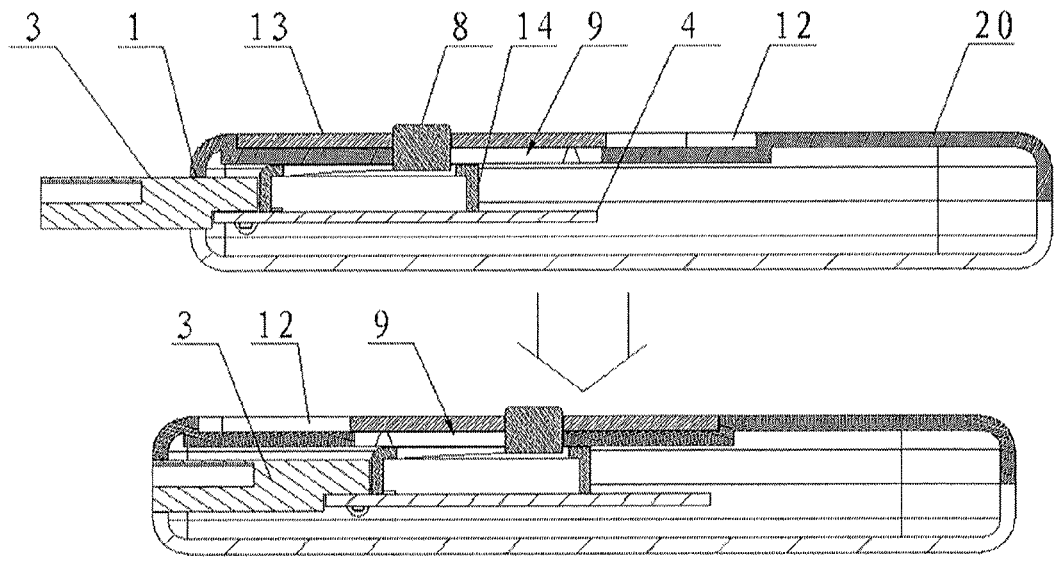
FIG. 3 is a schematic sectional view of the electronic apparatus with a plug shown in FIG. 2 along Line A-A.
Figure 4:
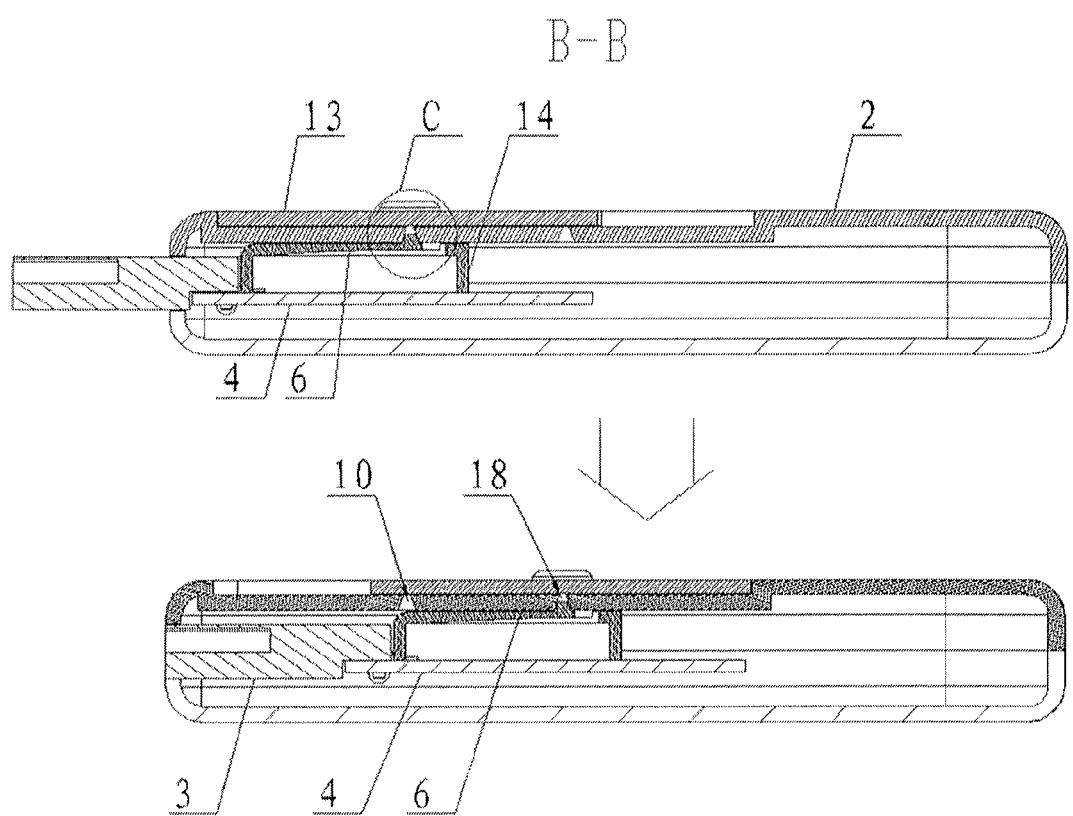
FIG. 4 is a schematic sectional view of the electronic apparatus with a plug shown in FIG. 2 along Line B-B.
Figure 5:
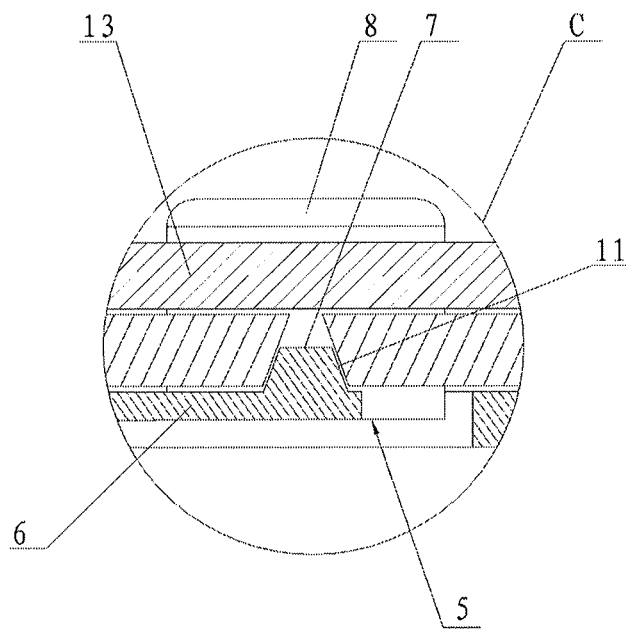
FIG. 5 is a schematic enlarged view at C in FIG. 4.

As shown in FIG. 2 to FIG. 4, an electronic apparatus with a plug provided in an embodiment of the present invention includes a housing 2 opened with a port 1, a plug 3 passing through the port 1, and a circuit board 4 located inside the housing 2 and electrically connected to the plug 3, where a locking mechanism 5 shown in FIG. 5 is disposed between the plug 3 and the housing 2, the locking mechanism 5 is configured to lock the plug 3 when the plug 3 is in a state of extending out of the port 1, and the loc king mechanism 5 automatically becomes ineffective when the plug 3 is impacted by a force in a direction in which the plug 3 retracts into the port 1.

Figure 1:
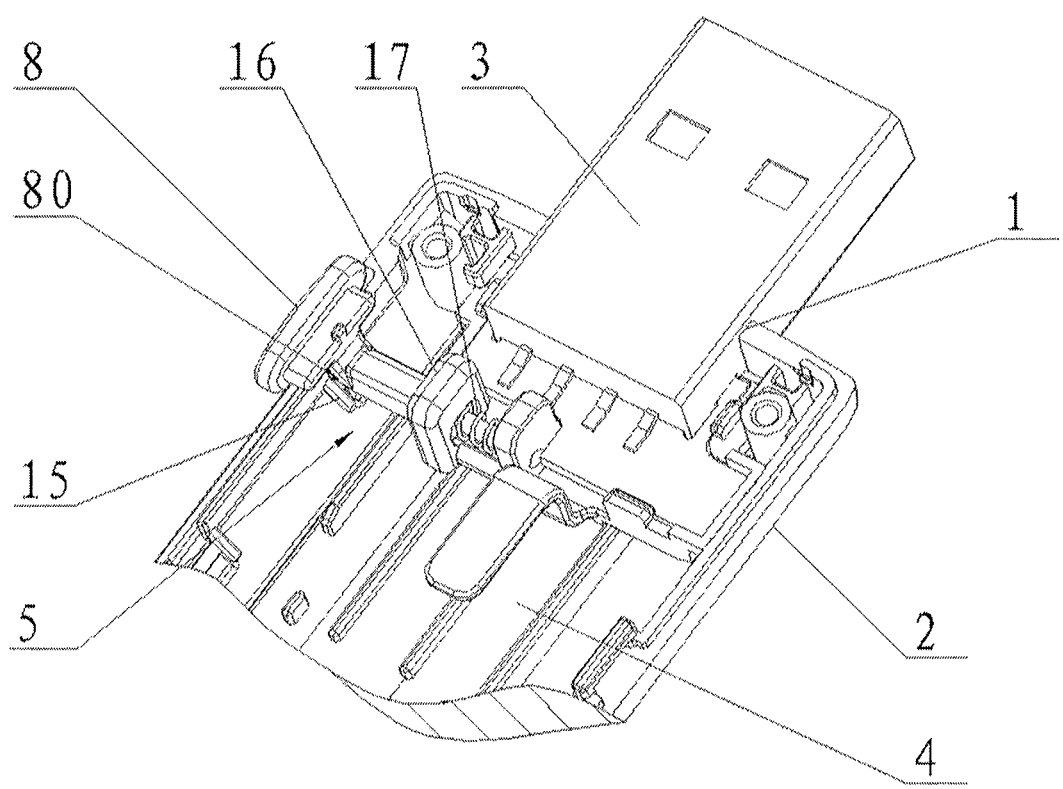
FIG. 1 is a schematic partial sectional view of an internal structure of an electronic apparatus with a plug in the prior art.

As in the embodiment of the present invention, the locking mechanism 5 shown in FIG. 5 automatically becomes ineffective when the plug 3 is impacted by a force in the direction in which the plug 3 retracts into the port 1, when the apparatus that the plug 3 is in a state of extending out of the port 1 is dropped on the floor by accident and the plug 3 is impacted, or when the apparatus that is already plugged into the slot is impacted by accident, the locking mechanism 5 automatically becomes ineffective. After the locking mechanism 5 automatically becomes ineffective, the plug 3 may slide in the direction in which the plug 3 retracts into the port 1, and under the effect of the impact force, the plug 3 slides back into the housing 2 in the direction in which the plug 3 retracts into the port 1. The larger the impact force is, the larger the distance that the plug 3 retracts in the direction in which the plug 3 retracts into the port 1 is, so that a buffering effect is achieved for the impact force, thereby preventing the impact force from damaging the plug 3, which solves the technical problem that a plug 3 of the existing electronic apparatus with a plug shown in FIG. 1 is easily damaged when the plug 3 in a state of extending out of the port 1 is impacted by a force in the direction in which the plug 3 retracts into the port 1.

Figure 7:
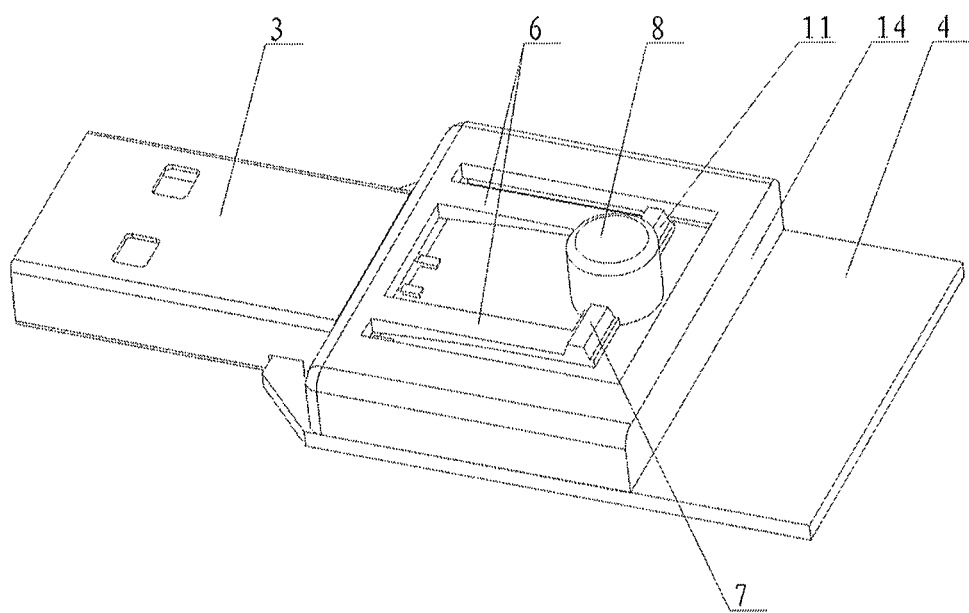
FIG. 7 is a schematic three-dimensional structural view of joints of a plug, a circuit board, and a connecting seat of an electronic apparatus with a plug according to an embodiment of the present invention.

The locking mechanism 5 shown in FIG. 5 includes elastic ribs 6 shown in FIG. 4 and FIG. 7 fixedly connected to the plug 3 shown in FIG. 2 and extending towards a sidewall 20 of the housing 2, a positioning projection 7 fixedly disposed at ends of the elastic ribs 6 away from the plug 3, and a button 8 fixedly connected to the positioning projection 7.

The sidewall 20 shown in FIG. 3 is opened with a sliding way 9 in parallel with the direction in which the plug 3 retracts into or extends out of the port 1, and the button 8 extends out of the sliding way 9 and may slide in the sliding way 9.

The sidewall 20 is further opened with a positioning slot 10 shown in FIG. 4. Gradually descending slope surfaces 11 shown in FIG. 5 and FIG. 7 are disposed at the end of the positioning projection 7 away from the plug 3, the positioning projection 7 is inserted inside the positioning slot 10, and the slope surfaces 11 are held against an inner wall of the positioning slot 10.

When the plug 3 is in a state of extending out of the port 1, the positioning projection 7 is inserted inside the positioning slot 10 and the slope surfaces 11 are held against the inner wall of the positioning slot 10. As the elastic ribs 6 extend towards one sidewall 20 of the housing 2, the elastic forces of the elastic ribs 6 also extend in the direction towards the sidewall 20. Under the effect of the elastic forces of the elastic ribs 6, the positioning projection 7 is forcefully held against and inserted inside the positioning slot 10, and with the blockage of the positioning slot 10, the plug 3 in the state of extending out of the port 1 is locked.

When the apparatus that the plug 3 is in the state of extending out of the port 1 is dropped on the floor by accident and the plug 3 is impacted, or when the apparatus that is already plugged into the slot is impacted by accident, as the gradually descending slope surfaces 11 on the positioning projection 7 are held against the inner wall of the positioning slot 10, the inner wall of the positioning slot 10 held against the slope surfaces 11 of the positioning projection 7 also must be an inclined surface. Under the effect of the impact force, the inclined surface of the inner wall of the positioning slot 10 applies reaction forces on the positioning projection 7. Forces opposite to the elastic forces of the elastic ribs 6 may be split from the reaction forces. Under the effect of the forces, the positioning projection 7 is detached from the positioning slot 10, and at the same time, under the effect of the impact force, the plug 3 slides back into the housing 2 in the direction in which the plug 3 retracts into the port 1, so that the impact force is buffered.

The circuit board 4 and the plug 3 are fixedly connected, and the elastic ribs 6 and the circuit board 4 are fixedly connected. The circuit board 4 has a relatively large surface area, the operation space is large for disposing both the plug 3 and the elastic ribs 6 on the circuit board 4, so at the same time, when the circuit board 4 and the plug 3 are fixedly connected, the structure of the electrical connection between the plug 3 and the circuit board 4 is more reliable. Of course, in this embodiment, the circuit board 4 and the plug 3 may also be electrically connected through wires, and at this time, the elastic ribs 6 may also be fixedly connected to the plug 3 directly.

The elastic ribs 6 are symmetrically disposed on the circuit board 4 about an axial center line of the port 1, the positioning projection 7 is a strip and is disposed between the symmetrically disposed elastic ribs 6, and the button 8 is located in the middle of the positioning projection 7. In such a structure, not only the symmetrically disposed elastic ribs 6 are subject to relatively even forces and the elasticity is better, but also the connectivity between the elastic ribs 6 and the positioning projection 7 is better.

A cross-section at a top of the positioning projection 7 is a trapezoid, which has a relatively large bottom side fixedly connected to the elastic rib 6. In such a structure, the surfaces where the positioning projection 7 and the inner wall of the positioning slot 10 away from and near the plug 3 are held against each other are all slope surfaces 11. When the plug 3 is impacted by a force in the direction in which the plug 3 retracts into the port 1, the inner wall of the positioning slot 10 near the plug 3 applies a smaller blocking force on the positioning projection 7 when the positioning projection 7 is detached from the positioning slot 10, which is beneficial for the locking mechanism 5 to automatically become ineffective.

Figure 6:
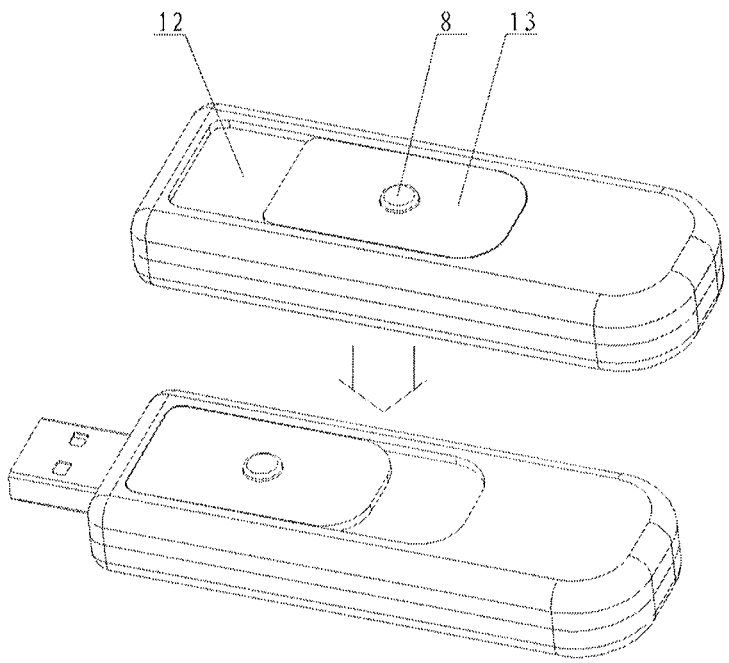
FIG. 6 is a schematic three-dimensional diagram of a process that a plug of an electronic apparatus with a plug switches from a state of retracting into a port into a state of extending out of the port according to an embodiment of the present invention.

The sidewall 20 shown in FIG. 2 is further provided with a sliding slot 12 shown in FIG. 6, the sliding way 9 shown in FIG. 3 is opened on a bottom surface of the sliding slot 12, the button 8 is fixedly connected to a board-shaped sliding block 13, and the sliding block 13 is inserted inside the sliding slot 12 and may slide inside the sliding slot 12 in a direction in which the sliding way 9 extends.

The board-shaped sliding block 13 not only increases a surface area of the button 8, so that when a user pushes the button 8, a force application area is larger and the touch feels better, but also makes the button 8 more stable in the slide process and slide in a more accurate direction.

An inner side of the sidewall 20, that is, a side near the elastic ribs 6 is further opened with retreat stop slot 18 having a shape matching with the top of the positioning projection 7. When the plug 3 is in the state of retracting into the port 1, the top of the positioning projection 7 is just inserted inside the retreat stop slot 18. When the plug 3 is in the state of retracting into the port 1, the retreat stop slot 18 accommodates the top of the positioning projection 7, so as to prevent the elastic ribs 6 from staying at a state of being pressed by the inner side of the sidewall 20, so that the situation that the elastic force decreases or even becomes unable to be restored is avoided.

A frame-shaped connecting seat 14 shown in FIG. 7 is fixedly disposed on the circuit board 4 around the plug 3, and the elastic ribs 6 are fixedly connected to the connecting seat 14.

The frame-shaped connecting seat 14 increases joint areas between the circuit board 4 and the plug 3 and between the circuit board 4 and the elastic ribs 6, so that the connection between the plug 3 and the circuit board 4 and between the circuit board 4 and the elastic ribs 6 is more reliable.

The connecting seat 14, the elastic ribs 6, and the button 8 shown in FIG. 7 are all made of a plastic material. The plastic material has a low cost and the elastic force thereof may satisfy the requirement of the elastic ribs 6, and at the same time, the connecting seat 14, the elastic ribs 6, and the button 8 made of the plastic material may be easily fabricated through welding or a one-step forming technology, so the fabrication becomes relatively convenient.

The sidewall 20 is one having the largest orthographic projection area of sidewalls of the housing 2. The housing 2 of the electronic apparatus with a plug shown in FIG. 2 usually has a simple structure, and the sidewall having the largest orthographic projection area of the housing 2 is usually the sidewall having a relatively large surface area, so an operation space is large when the sidewall 20 is disposed with various components or opened with various holes or slots.

The housing 2 shown in FIG. 2 in this embodiment is a cuboid, and the sidewall 20 having the largest orthographic projection area of the housing 2 also has the largest surface area. Of course, the shape of the housing 2 may also be designed into various shapes such as an ellipsoidal shape or a prismatic shape.

The electronic apparatus with a plug is a data card or a USB flash drive. The data card or USB flash drive has a small volume and high portability, and at the same time falls off easily, so the technical solutions provided in the embodiments of the present invention are very applicable.

It should be understood that the above descriptions are merely specific embodiments of the present invention, but not intended to limit the protection scope of the present invention. Any change or replacement readily apparent to persons skilled in the art within the technical scope disclosed by the present invention should fall within the protection scope of the present invention. Therefore, the protection scope of the present invention is subject to the appended claims.

What is claimed is:

1. An electronic apparatus with a plug, comprising a housing opened with a port, a plug passing through the port, and a circuit board located inside the housing and electrically connected to the plug, wherein a locking mechanism is disposed between the plug and the housing, the locking mechanism is configured to lock the plug when the plug is in a state of extending out of the port, and the locking mechanism automatically becomes ineffective when the plug is impacted by a force in a direction in which the plug retracts into the port;

wherein the locking mechanism comprises elastic ribs fixedly connected to the plug and extending towards a sidewall of the housing, a positioning projection fixedly disposed at ends of the elastic ribs away from the plug, and a button fixedly connected to the positioning projection, wherein, the sidewall is opened with a sliding way in parallel with the direction in which the plug retracts into or extends out of the port, and the button extends out of the sliding way and is capable of sliding in the sliding way; and the sidewall is further opened with a positioning slot, the end of the positioning projection away from the plug is disposed with gradually descending slope surfaces, the positioning projection is inserted inside the positioning slot, and the slope surfaces are held against an inner wall of the positioning slot.

2. The electronic apparatus with a plug according to claim 1, wherein the circuit board and the plug are fixedly connected, and the elastic ribs and the circuit board are fixedly connected.

3. The electronic apparatus with a plug according to claim 2, wherein the elastic ribs are symmetrically disposed on the circuit board about an axial center line of the port, the positioning projection is a strip and is disposed between the symmetrically disposed elastic ribs, and the button is located in the middle of the positioning projection.

4. The electronic apparatus with a plug according to claim 2, wherein a cross-section at the top of the positioning projection is a trapezoid having a relatively large bottom side fixedly connected to the elastic ribs.

5. The electronic apparatus with a plug according to claim 2, wherein the sidewall is further disposed with a sliding slot, the sliding way is opened on a bottom surface of the sliding slot, the button is fixedly connected to a board-shaped sliding block, and the sliding block is inserted inside the sliding slot and is capable of sliding inside the sliding slot in a direction in which the sliding way extends.

6. The electronic apparatus with a plug according to claim 2, wherein a frame-shaped connecting seat is fixedly disposed on the circuit board around the plug, and the elastic ribs and the connecting seat are fixedly connected.

7. The electronic apparatus with a plug according to claim 2, wherein the sidewall is one having the largest orthographic projection area of sidewalls of the housing.

8. The electronic apparatus with a plug according to claim 2, wherein the electronic apparatus with a plug is a data card or a Universal Serial Bus (USB) flash drive.

9. The electronic apparatus with a plug according to claim 3, wherein a cross-section at the top of the positioning projection is a trapezoid having a relatively large bottom side fixedly connected to the elastic ribs.

10. The electronic apparatus with a plug according to claim 3, wherein the sidewall is further disposed with a sliding slot, the sliding way is opened on a bottom surface of the sliding slot, the button is fixedly connected to a board-shaped sliding block, and the sliding block is inserted inside the sliding slot and is capable of sliding inside the sliding slot in a direction in which the sliding way extends.

11. The electronic apparatus with a plug according to claim 3, wherein a frame-shaped connecting seat is fixedly disposed on the circuit board around the plug, and the elastic ribs and the connecting seat are fixedly connected.

12. The electronic apparatus with a plug according to claim 3, wherein the sidewall is one having the largest orthographic projection area of sidewalls of the housing.

13. The electronic apparatus with a plug according to claim 1, wherein a cross-section at the top of the positioning projection is a trapezoid having a relatively large bottom side fixedly connected to the elastic ribs.

14. The electronic apparatus with a plug according to claim 1, wherein the sidewall is further disposed with a sliding slot, the sliding way is opened on a bottom surface of the sliding slot, the button is fixedly connected to a board-shaped sliding block, and the sliding block is inserted inside the sliding slot and is capable of sliding inside the sliding slot in a direction in which the sliding way extends.

15. The electronic apparatus with a plug according to claim 1, wherein a frame-shaped connecting seat is fixedly disposed on the circuit board around the plug, and the elastic ribs and the connecting seat are fixedly connected.

16. The electronic apparatus with a plug according to claim 15, wherein the connecting seat, the elastic ribs, and the button are all made of a plastic material.

17. The electronic apparatus with a plug according to claim 1, wherein the sidewall is one having the largest orthographic projection area of sidewalls of the housing.

18. The electronic apparatus with a plug according to claim 1, wherein the electronic apparatus with a plug is a data card or a Universal Serial Bus (USB) flash drive.

* * * * *